United States Patent [19]
Clarke

[11] Patent Number: 5,147,694
[45] Date of Patent: Sep. 15, 1992

[54] ELECTROMAGNETIC SHIELDING PANEL

[75] Inventor: Leslie T. Clarke, Wirral, United Kingdom

[73] Assignee: Pilkington PLC, St. Helens, England

[21] Appl. No.: 563,183

[22] Filed: Aug. 6, 1990

[30] Foreign Application Priority Data

Aug. 18, 1989 [GB] United Kingdom ............... 8918859

[51] Int. Cl.⁵ .................... E06B 3/24; H05K 9/00
[52] U.S. Cl. ................... 428/34; 428/192;
428/212; 428/213; 428/215; 428/415; 428/417;
428/418; 428/432; 428/433; 428/434; 428/469;
428/472; 428/699; 428/701; 428/702;
428/908.8; 174/35 MS; 52/788; 52/789; 52/790
[58] Field of Search .............. 428/34, 334, 333, 458,
428/192, 432, 433, 908.8, 212, 213, 215, 434,
415, 417, 418, 469, 472, 689, 699, 701, 702;
174/35 MS; 52/788, 790, 789; 358/245, 252,
255, 253

[56] References Cited
U.S. PATENT DOCUMENTS 3,591,248  7/1971  Meunier et al. ................. 350/1
4,670,347  6/1987  Lasik et al. .................... 428/458

FOREIGN PATENT DOCUMENTS 0277818  8/1988  European Pat. Off. .
0291591 11/1988  European Pat. Off. .
0322720  7/1989  European Pat. Off. .
2064629A  6/1981  United Kingdom .
2097288 11/1982  United Kingdom .
2174412A 11/1986  United Kingdom .
2201429A  9/1988  United Kingdom .
2205527A 12/1988  United Kingdom .

Primary Examiner—Ellis P. Robinson
Assistant Examiner—Donald J. Loney
Attorney, Agent, or Firm—Burns, Doane, Swecker & Mathis

[57] ABSTRACT

An electromagnetic shielding panel incorporates at least two electroconductive coatings. In two of the panels the coatings are carried on separate sheets of float glass one of the coatings being an anti-abrasive coating is on the outermost surface of the glass in the panel arrangement while the other coating being a relatively soft abrasive-sensitive coating, e.g. silver, is on the innermost of the glass in the panel arrangements. In other panel arrangements the two coatings are located on opposing sides of one glass sheet and in two of the panels a plain sheet of float glass is employed to protect the soft silver coating. In another panel a sheet of glass carrying an anti-abrasive coating is employed. The panels are of the double glazed and the laminated type. This invention utilizes the enhanced capacitive coupling between the two coatings to effectively earth the innermost silver coating by way of the anti-abrasive coating without any direct electrical connection being required to be made to the innermost coating.

29 Claims, 2 Drawing Sheets

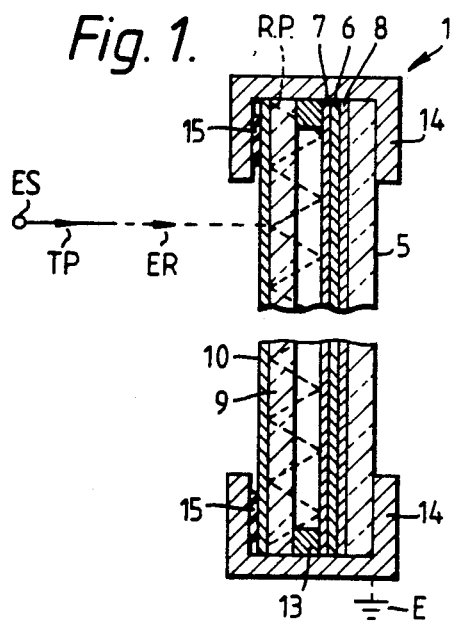
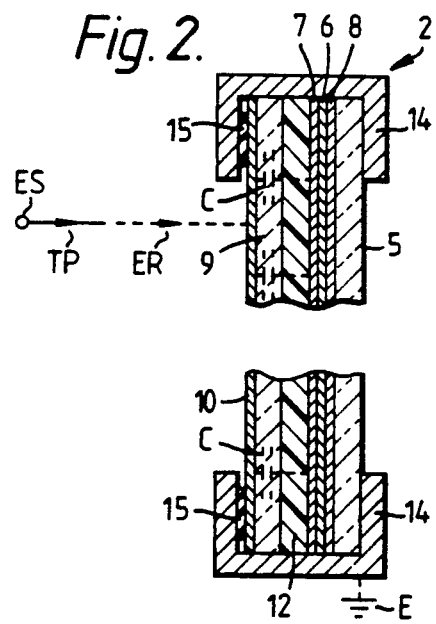
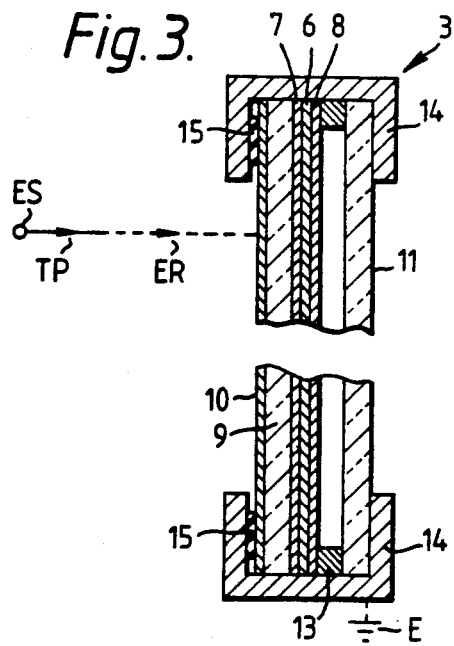
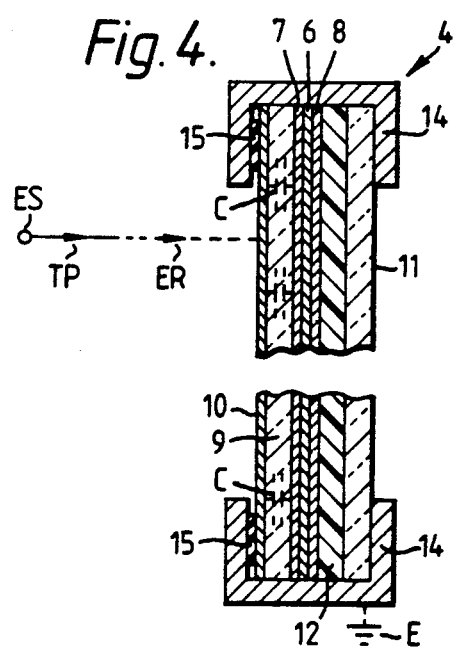

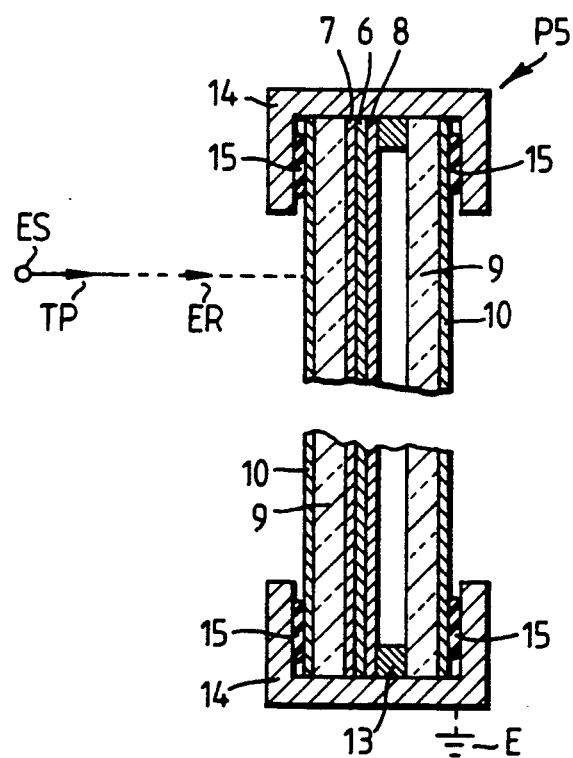

ELECTROMAGNETIC SHIELDING PANEL

BACKGROUND OF THE INVENTION

The present invention relates to electromagnetic shielding panels, and in particular, translucent panels for shielding against electromagnetic interference and which incorporate electroconductive coatings to attenuate electromagnetic radiation.

It is well known that glass and transparent plastics are translucent to short wave electromagnetic radiation and as a consequence such radiation can pass to and from buildings and/or electronic apparatus, such as computers and word processors, in buildings, and/or through protective visual panels on the apparatus. This is considered quite undesirable from an information security aspect as such radiation is readily detectable.

An effective solution to this problem has been proposed whereby all such electronic apparatus is accommodated within a completely electromagnetically shielded enclosure. Such an enclosure usually takes the form of a room without any windows in which the walls and door incorporate a mesh or metal foil which is electrically connected to earth. In such an arrangement, known as a Faraday cage, electromagnetic radiation neither leaves nor enters the room.

It is not always possible, however, for economic and/or aesthetic reasons, for example, to place all electronic apparatus processing sensitive information within such rooms or enclosures. Various alternative proposals are known whereby translucent shielding panels may serve as windows. These panels employ, amongst other things, electrically conductive coatings which are directly electrically connected to earth. Such panels inhibit the transmission of electromagnetic radiation.

For instance, patent specification GB-B-2 064 629 discloses not only an electromagnetic shielding panel which comprises glass panes which incorporate an electroconductive coating but also glass panes which incorporate a fine electrically conductive woven mesh.

To obtain the required attenuation of the electromagnetic radiation, it is essential that the coating and the mesh are connected to earth and this is achieved by means of direct physical electrical connections to both the coating and the mesh.

A disadvantage with this type of panel is that visibility through it is impaired by the conductive mesh.

In another shielding panel arrangement disclosed in patent specification EP-A-222151 improved visibility is obtained. The shielding panel comprises a pair of spaced glass panes on opposing sides of a pair of spaced parallel electrically conductive transparent films mounted in a taut condition in the space between the panes. This panel also has the requirement to electrically connect both the electrically conductive films to earth by a direct physical electrical connection.

In a further shielding panel arrangement disclosed in patent specification GB-A-2 205 527 the panel comprises two electro-conductively coated glass panes arranged in opposed parallel spaced relationship with the coatings facing inwardly towards each other. This shielding panel has the advantages that it provides good attenuation of electromagnetic radiation while additionally providing good optical qualities. Nevertheless, there remains the requirement to make electrical connection to the coatings directly with a physical electrical connection for connection to earth. In this arrangement this is achieved by means of electrically conductive wire mesh making direct electrical contact with the coatings themselves.

Electromagnetic shielding panels fall into several general categories i.e. they may be of the double glazed type with air or gas between two spaced apart parallel panes of glass or they may be of the laminar type with a plastics interlayer sandwiched between two parallel panes of glass. They may even be a combination of both these types.

Generally, where an electroconductive coating or transparent film is employed and because of the delicate nature of such coatings or transparent films, there is a need to protect them from damage. Accordingly such coatings or transparent films usually face inwardly within the panel and may, for example, be protected by a glass outer pane.

As a consequence of this type of construction, there is always a problem of making good direct physical connnection to the inner coating or transparent film which may in certain circumstances prove quite difficult and be expensive in the manufacturing process. For example, in the double glazed constructed units the connection means may adversely impair the environment seal.

An aim of this invention is to provide an electromagnetic shielding panel which overcomes the aforementioned disadvantages, provides effective attenuation to electromagnetic radiation and which also has good optical qualities.

BRIEF SUMMARY OF THE INVENTION

According to this invention there is provided an electromagnetic shielding panel comprising first and second panes each independent of glass or plastics said first and second panes each having major inner and outer surfaces thereof, and being positioned in opposed spaced parallel relationship and first and second electroconductive coatings said first electroconductive coating being located on the major outer surface of the first pane of glass or plastics and the second electroconductive coating being located between the first and second panes of glass or plastics, wherein the second electroconductive coating is electrically coupled to the first electroconductive coating so that, in use of the shielding panel, direct electrical connection to the first electroconductive coating to enable said first electroconductive coating to be connected to earth also provides for connection of the second electroconductive coating to earth to provide effective attenuation of electromagnetic radiation in the path of the shielding panel while providing good optical qualities.

The second electroconductive coating may be located upon a major surface of the first or the second pane of glass or plastics and when located on the major inner surface of the first pane of glass or plastics opposite the first electroconductive coating the second pane of glass or plastics may comprise either clear glass or plastics or coated glass having a coating corresponding to that of the first electroconductive coating, to form a) a double glazed panel incorporating an air or gas space between the panes which may be in the range 6 mm to 20 mm, or b) a laminate incorporating a plastics interlayer which may have a thickness between 0.38 mm and 1 mm between the panes of glass of plastics.

In the event that the second electroconductive coating is located upon the major inner surface of the second pane of glass or plastics the second pane of glass or plastics is preferably spaced from the first pane of glass or plastics to form a) a double glazed panel incorporating an air or gas space between the panes which may be in the range 6 mm to 20 mm, or b) a laminate incorporating a plastics interlayer which may have a thickness between 0.38 mm and 1 mm between the panes of glass or plastics.

Preferably the gas or air space is 12 mm and the plastics interlayer has a thickness of 0.5 mm.

Preferably the first electroconductive coating is a transparent abrasion resistant coating which may conveniently be of a semiconductor metal oxide, for example, tin doped indium oxide or doped tin oxide. Fluorine doped tin oxide coatings produced by pyrolytic techniques are admirably suitable for this purpose.

The transparent abrasion resistant coating which will usually comprise a semiconductor metal oxide layer of the order of 150 nm to 1000 nm preferably 300 nm to 400 nm in thickness may also include one or more colour suppressing underlayers as described, for example, in GB-B-2031756 or GB-B-2015983.

Preferably the second electroconductive coating is a silver layer having a thickness between 10 nm and 50 nm, but may be a gold or copper layer. The use of a silver layer having a thickness of at least 15 nm enables an electroconductive coating to yield a sheet resistance of 5 ohms per square. Preferably electroconductive coatings have a silver layer at least 22.5 nm thick to provide a sheet resistance lower than 5 ohms per square.

As thicker silver layers are more expensive and as a consequence of such thicker coatings producing a lower light transmission, the silver layer preferably has a thickness less than 40 nm. Preferred coatings have a silver layer having a thickness in the range 10 nm to 30 nm. To enhance the light transmission of the coated glass, the silver layer may be sandwiched between anti-reflection layers of metal oxide. The metal oxide may be selected from titanium oxide, tin oxide, indium tin oxide, zinc oxide and bismuth oxide. The thickness of the anti-reflection layers is preferably in the range of 20 nm to 70 nm. It is preferred to use tin oxide for the anti-reflection layers and, for optimum light transmission, the tin oxide layers will each have a thickness in the range 30 nm to 50 nm depending on the thickness of the silver layer.

The shielding panel is preferably supported in an electrically-conductive support means which is electrically connectable to earth. A direct physical electrical connection is preferably made from the first electroconductive coating to the support means by means of peripheral electrically-conductive compressible means sandwiched between the first electroconductive coating and the support means. The electrically conductive compressible means is preferably a gasket of the metal loaded rubber type or may be the zinc metal mesh type.

Preferably the second electroconductive coating is coupled to the first electroconductive coating by capacitive means, said capacitive means comprising distributed internal capacitance present between the first and second electroconductive coatings.

The shielding panel as referred to herein is eminently suitable as a light translucent shield against electromagnetic radiation having a frequency in the range 30 MHz to 20 GHz.

The invention will be more readily understood from the following description of several exemplary embodiments and examples which should be read in conjunction with the accompanying drawing in which:

BRIEF DESCRIPTION OF THE DRAWINGS

FIG. 1 shows a sectional view of one embodiment in the form of a double glazed type electromagnetic shielding panel in accordance with this invention;

FIG. 2 shows a sectional view of an embodiment similar to that of FIG. 1, but in the form of a laminar type electromagnetic shielding panel in accordance with this invention;

FIG. 3 shows a sectional view of another embodiment in the form of a double glazed type electromagnetic shielding panel in accordance with this invention;

FIG. 4 shows a sectional view of an embodiment similar to that of FIG. 3, but in the form of a laminar type electromagnetic shielding panel in accordance with this invention; and FIG. 5 shows a sectional view of a further embodiment of a double glazed type electromagnetic shielding panel in accordance with this invention which is similar to that shown in FIG. 3, but having the pane of clear float glass replaced by a pane of coated glass.

DESCRIPTION OF THE PREFERRED EMBODIMENT

Referring to the drawing, it should be understood that for simplicity, like components in the drawing (comprising FIG. 1 to FIG. 5), are referenced by indentical designations.

In the examples which are to be considered, two of the shielding panels 1 and 2 (FIG. 1 and FIG. 2) make use of commercially available low emissivity type coated glasses. One type comprises a pane of 3 mm to 6 mm clear float glass 5, for instance, coated with a translucent electroconductive coating comprising a layer of silver 6 sandwiched between anti-reflection layers 7 and 8 of metal oxide (produced as described in GB-B-2 129 831). Coated glass of this type is commercially available from PILKINGTON GLASS LIMITED of ST. HELENS, ENGLAND, under the trade mark KAPPAFLOAT. The conductivity of the coating depends on the thickness of the silver layer and may be of the order of 2, 5 or 10 ohms per square.

The use of a silver layer having a thickness of at least 15 nm enables a coating with a sheet resistance of less than 5 ohms per square to be achieved. Preferred coatings have a silver layer at least 22.5 nm thick to provide even lower sheet resistance. Unfortunately, the thicker the silver layer, the greater the cost of the coating and the lower the light transmission of the coated glass. Thus the silver layer preferably has a thickness of less than 40 nm. Especially preferred coatings have a silver layer having a thickness in the range 10 to 30 nm.

As has been mentioned, the silver layer may be sandwiched between anti-reflection layers of metal oxide, the outer layer serving to protect the silver. Examples of metal oxide which may be used include titanium oxide, tin oxide, indium tin oxide, zinc oxide and bismuth oxide. The anti-reflection layers will generally each have a thickness in the range 20 nm to 70 nm. It is preferred to use tin oxide for the anti-reflection layers and, for optimum light transmission, the tin oxide layers will each have a thickness in the range 30 nm to 50 nm depending on the thickness of the silver layer.

The other type of low emissivity coated glass has a transparent abrasion-resistant coating comprising a semiconductor metal oxide layer 10, for example, tin doped indium oxide or doped tin oxide. Glass with fluorine doped tin oxide coatings produced by pyrolytic techniques are commercially available and suitable for use in this application. Coated glasses of this type are commercially available from PILKINGTON GLASS LIMITED of ST. HELENS, ENGLAND under the trade name PILKINGTON K-GLASS. The conductivity of the coating will depend on the nature and proportion of dopant(s) present and the thickness of the coating; one coated glass currently available is PILKINGTON K-GLASS has a conductivity of the order of 17 ohms per square.

The two shielding panels 3 and 4 (FIG. 3 and FIG. 4) incorporate panes with abrasion-resistant electroconductive coating which additionally includes on the major surface opposite its abrasion resistant coating 10, a coating 6,7 and 8 identical with that incorporated in neutral KAPPAFLOAT low emissivity coated glass. This coating is protected by either a pane of clear float glass 11, or a pane of glass with an abrasion-resistant coating in the double glazed shielding panel 3 having a space between the panes in the range 6 mm to 20 mm, and in the laminar shielding panel 4 by a pane of clear float glass 11 or a pane of glass with an abrasion resistant coating and a plastics interlayer 12 which has a thickness between 0.38 mm and 1 mm.

In the examples to be considered, the glass panes (coated or otherwise) employed in the construction of the shielding panels 1,2 3 and 4 measure 1 meter square and they are mounted in an electrically conductive supporting frame 14 which is directly connectable to earth E.

It should be understood from FIG. 1 to FIG. 5 that all of the shielding panels 1, 2, 3, 4 and P5 incorporate at least one basic coated glass pane with an abrasive-resistant electroconductive coating with the coating facing outwardly. Conveniently direct physical electrical connection with, and around the periphery of, the outer coating 10, is made by means of a suitable peripheral electrically-conductive compressible gasket 15 which is sandwiched between the periphery of coated glass pane 9, 10, and the electrically-conductive supporting frame 14. The gasket 15 may conveniently be a metal loaded rubber type or a fine metal mesh type.

Electrical connection of the inner coating 6, 7 and 8 is effected by making use of the distributed internal capacitance C (illustrated diagrammatically in panel 2 and panel 4 for convenience) present between the two coatigs. In effect the inner coating is effectively capacitively coupled to the outer coating which is directly electrically connected to the supporting frame 14 by way of the gasket 15 and then to earth E.

The major attenuation of electromagnetic radiation relies upon reflection of electromagnetic waves at the first conductive coating of the panel. This is effected as a consequence of the mismatch of impedance of the incoming wave (377 ohms in the "Far Field" being greater than $\lambda/2\pi$ from a radiation source ES) and the combined impedance of the coatings. Further attenuation is achieved as a consequence of multiple reflections between electroconductive coating on the glass. Attenuation may also be attributed to absorption loss within the glass itself where the path length of the electromagnetic wave is greatly increased due to the multiple reflections effectively making the glass appear much thicker than it actually is. Such multiple reflections are shown in FIG. 1 for convenience and are represented diagrammatically by the broken lines designated RP extending between the two coatings (such multiple reflections occur in a manner similar so that shown in panel 1 in the other illustrated panels).

In the examples to be considered, the light reflection and light transmission of the panel were measured and the attenuation or shielding effectiveness to the transmission of electromagnetic radiation ER through the panel from the electromagnetic radiation ER through the panel from the electromagnetic radiation sources ES travelling along a transmission path TP normal to the panel surface was determined over the frequency range 50 MHz to 10 GHz.

The invention is illustrated but not limited by the following Examples.

EXAMPLE 1

Panel 1 is of the double glazed type and comprises two coated glass panes which are arranged in spaced parallel relationship being separated by a peripheral environmental seal 13. The first pane is, for example, of PILKINGTON K-Glass with the coating facing outwardly of the panel and the second pane is of neutral KAPPAFLOAT glass with the coating facing inwardly of the panel.

The thickness of the silver layer in the neutral KAPPAFLOAT pane is of the order of 15 nm giving a conductivity (sheet resistance) of 5 ohms per square. The conductivity of the external coating is of the order of 17 ohms per square. The dimension of the space between the panels is of the order of 12 mm.

The following results were obtained:
Light reflection: 14%
Light transmission: 70%
Shielding effectiveness: 32 db

EXAMPLE 2

Panel 2 is of the laminar type and comprises two coated glass panes of the type specified for panel 1. The two coated panes are laminated together using a polyvinylbutyral interlayer 13 0.5 mm thick. The thickness of the silver layer in the neutral KAPPAFLOAT pane is of the order of 22.5 nm giving a conductivity (sheet resistance) of 2 ohms per square. The conductivity of the external coating is of the order of 17 ohms per square.

The following results were obtained:
Light reflection: 42%
Light transmission: 40%
Shielding effectiveness: 37 dB

EXAMPLE 3

Panel 3 is a further double glazed type panel but in this construction as explained previously the PILKINGTON K-GLASS coated pane has a coating 6,7 and 8 identical with the neutral KAPPAFLOAT low emissivity coated glass on the major surface opposite the abrasive-resistant coating 10. The conductivity of the abrasive-resistant coating is of the order of 17 ohms per square while the thickness of the silver layer is 15 nm giving a conductivity of 5 ohms per square. The inner coating is protected by a pane of clear glass 12 spaced by a peripheral environmental seal 14 at 12 mm from the inner coating.

The following results were obtained:
Light reflection: 15%
Light transmission: 67%
Shielding effectiveness: 37 dB In this example, when the silver layer is 22.5 nm in thickness giving a conductivity of 2 ohms per square was used, the following results were obtained:
Light reflection: 35%
Light transmission: 47%
Shielding effectiveness: 50 dB

EXAMPLE 4

Panel 4 is the laminar construction of panel 3 and only differs by the polyvinylbutyral interlayer 13 which is 0.5 mm thick. Two different conductivity coated glasses were tested giving the following results:
a) 2 ohms per square
Light reflection: 40%
Light transmission: 43%
Shielding effectiveness: 40 dB
b) 5 ohms per square
Light reflection: 20%
Light transmission: 60%
Shielding effectiveness: 35 dB

EXAMPLE 5

In this example, reference is made to FIG. 5. The construction of the panel for this example is identical with panel 3 (FIG. 3) except that the pane of clear glass is replaced by a pane of PILKINGTON K-GLASS. Thus, the panel of this example has two panes of PILKINGTON K-GLASS. One of the panes of PILKINGTON K-GLASS has a coating 6, 7 and 8 identical with the KAPPAFLOAT low emissivity coated glass on the major surface opposite the abrasive resistant coating 10. The conductivity of the abrasive resistant coating is of the order of 17 ohms per square while the thickness of the silver layer is 22.5 nm giving a conductivity of 2 ohms per square. The inner coating is protected by a pane of PILKINGTON K-GLASS 9, 10, spaced by the peripheral environment seal 13 at 12 nm from the inner coating.

The following results were obtained:
Light reflection: 35%
Light transmission: 44%
Shielding effectiveness: 55 dB It will be apparent to those skilled in the art that the replacement of the pane of clear glass with a pane of PILKINGTON K-GLASS in the laminar construction of panel 4 (FIG. 4) is yet a further construction yielding improved shielding effectiveness.

It will also be apparent to those skilled in the art that the inner electroconductive coating may, instead of being located on the glass surface, take the form of a conductive coating incorporated on a separate plastics material. For instance, the polyvinyl butyral interlayer 13 could conveniently incorporate a metalised polyester film.

An important advantage of the present invention is that, by using, as a first electroconductive coating, a transparent abrasion resistant electroconductive coating on the outer major surface of the first pane, and relying on enhanced capacitive coupling C between that coating and the second electroconductive coating, it is possible to effectively earth a second abrasion sensitive electroconductive coating (for example a coating comprising a layer of silver) protected between the panes, without any special electrical connections being made to any coating between the panes.

A major advantage accruing from this is that the second electroconductive coating may be stripped back all around the periphery of the panel in the double glazed constructions which considerably improves the perimeter environmental seal. The panel further provides a substantial improvement in the attenuation of electromagnetic radiation. Thus, by suitable selection of silver coatings it is possible to obtain good optical qualities together with an improved attenuation factor with electromagnetic shielding panels according to this invention.

While the invention has been described and illustrated using glass panes it would be possible to obtain similar results using transparent plastics panes.

What is claimed is:

1. An electromagnetic shielding panel comprising in combination;
   first and second panes, each independent, of glass or plastics said first and second panes each having major inner and outer surfaces thereof, and being positioned in opposed spaced parallel relationship; and, first and second electroconductive coatings, said first electroconductive coating being located on the major outer surface of the first pane of glass or plastics and the second electroconductive coating being located between the first and second panes of glass or plastics, wherein the second electroconductive coating is electrically coupled to the first electroconductive coating so that, in use of the shielding panel, direct electrical connection to the first electroconductive coating to enable said first electroconductive coating to be connected to earth also provides for the connection of the second electroconductive coating to earth to provide effective attenuation of electromagnetic radiation in the path of the shielding panel while providing good optical qualities.

2. An electromagnetic shielding panel as claimed in claim 1, wherein the second electroconductive coating is located on the major inner surface of the first pane of glass or plastics opposite the first electroconductive coating and the second pane of glass or plastics comprises clear glass or plastics.

3. An electromagnetic shielding panel as claimed in claim 1, wherein the second electroconductive coating is located on the major inner surface of the first pane of glass or plastics opposite the first electroconductive coating and the second pane of glass or plastics comprises coated glass having a coating corresponding to that of the first electroconductive coating.

4. An electromagnetic shielding panel as claimed in claim 1, wherein the second electroconductive coating is located on the major inner surface of the second pane of glass or plastics.

5. An electromagnetic shielding panel as claimed in claim 1, wherein the shielding panel is a double glazed panel incorporating an air or gas space between the panes of glass or plastics.

6. An electromagnetic shielding panel as claimed in claim 5, wherein the air or gas space is in the range 6 mm to 20 mm.

7. An electromagnetic shielding panel as claimed in claim 5, wherein the air or gas space is 12 mm.

8. An electromagnetic shielding panel as claimed in claim 1, wherein the shielding panel is a laminate incorporating a plastics interlayer between the panes of glass or plastics.

9. An electromagnetic shielding panel as claimed in claim 8, wherein the plastics interlayer has a thickness between 0.38 mm and 1 mm.

10. An electromagnetic shielding panel as claimed in claim 8, wherein the plastics interlayer has a thickness of 0.5 mm.

11. An electromagnetic shielding panel as claimed in claim 1, wherein the first electroconductive coating comprises a transparent abrasion-resistant coating.

12. An electromagnetic shielding panel as claimed in claim 11, wherein the transparent abrasion resistant coating comprises a semiconductor metal oxide.

13. An electromagnetic shielding panel as claimed in claim 12, wherein the semiconductor metal oxide comprises tin doped indium oxide.

14. An electromagnetic shielding panel as claimed in claim 12, wherein the semiconductor metal oxide comprises doped tin oxide.

15. An electromagnetic shielding panel as claimed in claim 12, wherein the semiconductor metal oxide comprises fluorine doped tin oxide produced by pyrolytic techniques.

16. An electromagnetic shielding panel as claimed in claim 11, wherein the thickness of the transparent abrasion resistant coating is between 150 nm and 1000 nm.

17. An electromagnetic shielding panel as claimed in any one preceding claim 1, wherein the second electroconductive coating is a silver layer having a thickness between 10 nm and 50 nm.

18. An electromagnetic shielding panel as claimed in claim 1, wherein the the second electroconductive coating is a silver layer having a thickness of at least 10 nm.

19. An electromagnetic shielding panel as claimed in claim 1, wherein the second electroconductive coating is a silver layer having a thickness of at least 15 nm.

20. An electromagnetic shielding panel as claimed in claim 1, wherein the second electroconductive coating is a silver layer having a thickness of at least 22.5 nm.

21. An electromagnetic shielding panel as claimed in claim 1, wherein the silver layer is sandwiched between anti-reflection layers of metal oxide.

22. An electromagnetic shielding panel as claimed in claim 21, wherein the anti-reflection layers comprise layers of tin oxide.

23. An electromagnetic shielding panel as claimed in claim 22 wherein each tin oxide anti-reflection layer has a thickness in the range 30 nm to 50 nm.

24. An electromagnetic shielding panel as claimed in claim 1, wherein the shielding panel is supported in an electrically conductive support in means which is electrically connectable to earth.

25. An electromagnetic shielding panel as claimed in claim 24, wherein a direct physical electrical connection is made from the first electroconductive coating to the support means by means of peripheral electrically-conductive compressible means sandwiched between the first electrically conductive coating and the support means.

26. An electromagnetic shielding panel as claimed in claim 25, wherein the electrically conductive compressible means comprises a metal loaded rubber gasket.

27. An electromagnetic shielding panel as claimed in claim 25, wherein the electrically conductive compressible means comprises a metal mesh gasket.

28. An electromagnetic shielding panel as claimed in claim 1, wherein the second electroconductive coating is electrically coupled to the first electroconductive coating by capacitive means, said capacitive means comprising distributed internal capacitance present between the first and second electroconductive coatings.

29. An electromagnetic shielding panel as claimed in claim 1, wherein the panel serves as a light translucent shield against electromagnetic radiation having a frequency in the range 30 MHz to 20 GHz.

* * * * *